United States Patent [19]

Akaike et al.

[11] Patent Number: 5,536,354

[45] Date of Patent: Jul. 16, 1996

[54] SOLID PHASE BONDING METHOD

[75] Inventors: Masatake Akaike, Atsugi; Hiroshi Matsuda, Isehara, both of Japan

[73] Assignee: Canon Kabushiki Kaisha, Tokyo, Japan

[21] Appl. No.: 223,683

[22] Filed: Apr. 6, 1994

[30] Foreign Application Priority Data

Apr. 23, 1993 [JP] Japan ................................. 5-097737

[51] Int. Cl.$^6$ .................................................. B32B 31/00
[52] U.S. Cl. ..................... 156/272.8; 156/273.1; 156/273.3; 156/273.5; 156/273.9; 156/274.4
[58] Field of Search ............................ 156/272.8, 273.1, 156/273.3, 273.5, 273.9, 274.4

[56] References Cited

U.S. PATENT DOCUMENTS 5,208,111  5/1993  Decher et al. .

5,368,942  11/1994  Smith et al. .

FOREIGN PATENT DOCUMENTS 56-53886  5/1981  Japan .

Primary Examiner—Chester T. Barry
Attorney, Agent, or Firm—Fitzpatrick, Cella, Harper & Scinto

[57] ABSTRACT

A solid phase junction method using a simpler process for accurately bonding solid phases without operating in an ultra-high vacuum. This method for bonding at least two solid members includes a step (A) of forming at least one of i) a monomolecular film; and ii) a monomolecular built-up film on at least one of the two junction surfaces, a step (B) of adhering the members through the junction surfaces, a step (C) of applying an electric field to the junction surfaces, and, if necessary, a step (D) of heating the junction surfaces or a step (E) of irradiating the junction surfaces with laser light.

12 Claims, 5 Drawing Sheets

LB film 50

LB film 51

SOLID PHASE BONDING METHOD

BACKGROUND OF THE INVENTION

1. Field of the Invention

This invention relates to solid phase bonding methods and, more particularly, to a solid phase bonding method of bonding solid bodies (solid phases) by applying an insulating monomolecular film or monomolecular built-up film to the interface of the solid bodies or junction surfaces.

2. Description of the Related Art

Conventionally, bonding of solid phases is ordinarily made by a method such as one disclosed in Japanese Patent Laid-Open Publication No. 56-53886 in which interfaces are first cleaned by ion bombardment in an ultra-high vacuum or by other means. Before a contamination due to adsorption takes place, the surfaces to be bonded are brought into abutment so that the distance between the bonded surface is reduced to the interatomic distance.

However, this conventional method, necessitating the operations for cleaning and bonding interfaces in an ultra-high vacuum atmosphere, entails problems described below.

1) A large-scale processing apparatus for forming an ultra-high vacuum atmosphere is required.

2) Aligning interfaces in an ultra-high vacuum atmosphere is difficult.

3) The bonding accuracy is unsatisfactory.

SUMMARY OF THE INVENTION

In view of the above-described problems of the conventional art, an object of the present invention is to provide a solid phase bonding method for accurately bonding solid bodies (solid phases) by a simple process.

To achieve this object, according to one aspect of the present invention, there is provided a method for bonding at least two solid members, comprising a step (A) of forming a monomolecular film or a monomolecular built-up film on at least one of two interfaces, a step (B) of adhering the members through the interfaces, and a step (C) of applying an electric field to the interfaces.

According to another aspect of the present invention, there is provided a method for bonding at least two solid members, comprising a step (A) of forming a monomolecular film or a monomolecular built-up film on at least one of two interfaces, a step (B) of adhering the members through the interfaces, a step (C) of applying an electric field to the interfaces, and a step (D) of heating the interfaces.

According to a further aspect of the present invention, there is provided a method for bonding at least two solid members, comprising a step (A) of forming a monomolecular film or a monomolecular built-up film on at least one of two interfaces, a step (B) of adhering the members through the interfaces, a step (C) of applying an electric field to the interfaces, and a step (E) of irradiating the interfaces with laser light.

DESCRIPTION OF THE PREFERRED EMBODIMENTS

In the above-described methods in the second and third aspects of the present invention, the steps (C) and (D) or the steps (C) and (E) may be executed in this order or substantially simultaneously with each other.

In accordance with the present invention, at least one layer of an insulating monomolecular film or monomolecular built-up film, i.e., a Langmuir-Blodgett film (LB film) which provides a hydrophobic surface or hydrophilic surface is built up on at least one bonding surface, and the resulting bonding surfaces (= interfaces) each formed of hydrophobic radicals or hydrophilic radicals are opposed to each other and positioned relative to each other in a superposed state. Thereafter they are pressed lightly against each other for temporary bonding at the time of positioning. That is, hydrophobic radicals or hydrophilic radicals are caused to bond to each other to prevent occurrence of a misalignment after the positioning and to facilitate handling after the positioning. After the positioning, a voltage is applied from opposite sides of the bonding surfaces between which the LB film is interposed.

Figure 1:
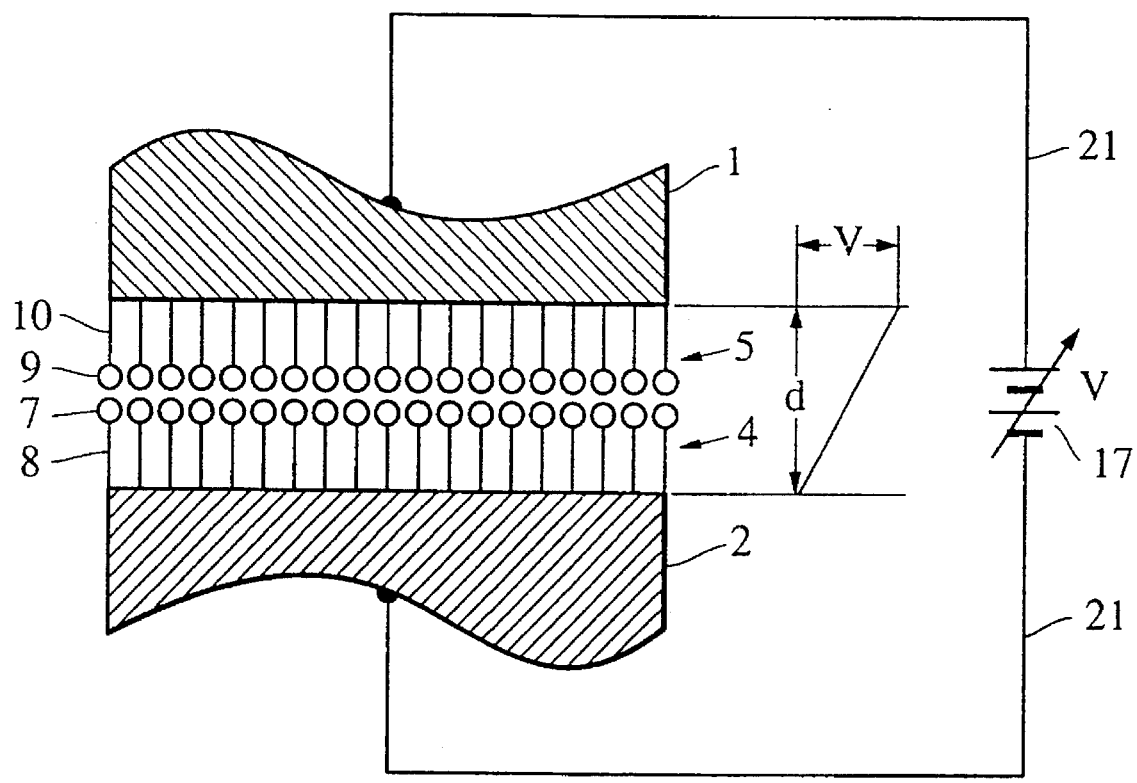
FIG. 1 is a diagram of electrostatic attraction acting between substrates.

If the LB film functions as a high-withstand-voltage insulating film under such a condition, a high electric field V/d is caused between the bonding surfaces as shown in FIG. 1. In FIG. 1 are illustrated Si substrates 1 and 2, monomolecular films 4 and 5, hydrophilic groups 7 and 9, hydrophobic groups 8 and 10, a power source 17 and lead wires 21. By this electric field, electrostatic attraction force F shown below acts between the bonding surfaces.

$$F = \epsilon (V/d)^2 / 2 \quad (1)$$

where $\epsilon$ is a dielectric constant of the LB film; V is the difference between the potentials of the bonding surfaces; and d is the gap between the bonding surfaces (i.e., the thickness of the LB film).

As can be understood from the equation (1), if an LB film which makes it possible to increase the electric field strength is used (the thinner LB film has higher defect density in many cases and this would deteriorate the electric property of LB film), the electrostatic attraction force F can be increased and the bonding surfaces can be brought closer to each other by the electrostatic attraction so that the distance therebetween is on an interatomic order. That is, stronger bonding can therefore be achieved. In a suitable LB film that gap "d" is minimized (the thinnest LB film may be the best in this respect), and the LB film has a high withstand insulating property. (The thinner LB film often has a higher defect density which would deteriorate the electrical properties of the LB film). Any materials which are suitable for the LB method can be properly used in the present invention. For example, fatty acids or their derivatives where the total number of carbon is from 16 to 30, preferably from 18 to 24, is one of the most conventional materials. The film thickness is preferably no larger than 500 Å, more preferably no larger than 200 Å.

After the bonding surfaces have been brought closer to set a distance on an interatomic order therebetween, the LB film is decomposed by a heat treatment or laser irradiation. In this process step, the LB film is decomposed and evaporated to enable the bonding surfaces to bond to each other directly. Even in a case where a ferroelectric LB film other than the high withstand insulating LB film is used, the same bonding effect as that described above can be achieved.

The present invention will be described with reference to the embodiments thereof.

[Embodiment 1]

Figure 2A:
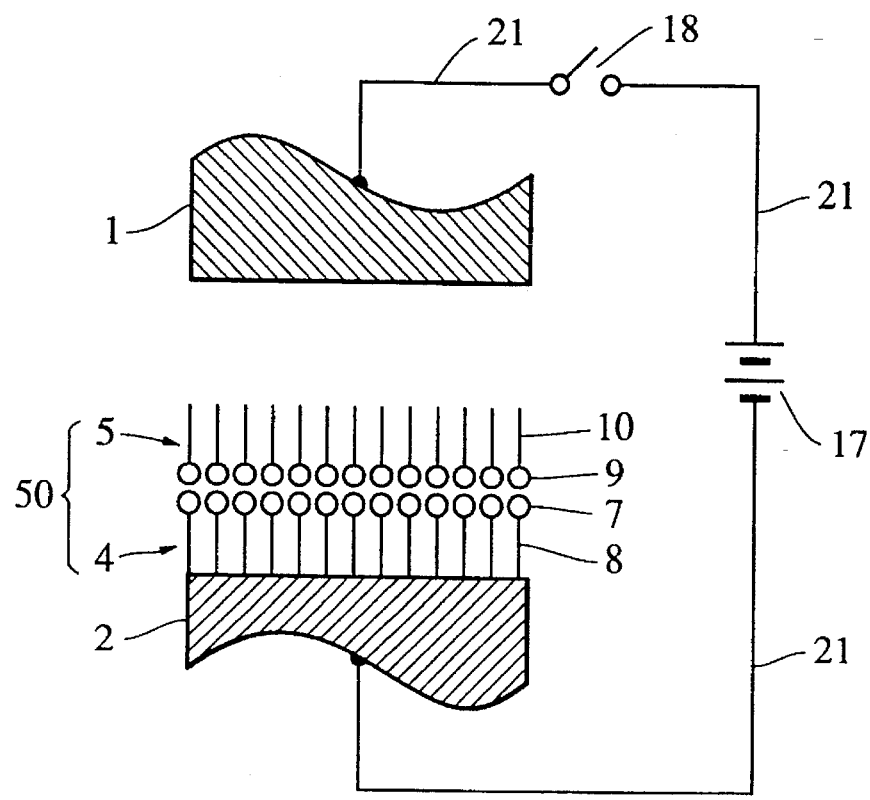
FIG. 2 is a cross-sectional view of bonding in accordance with a first embodiment of the present invention.

FIG. 2 is a diagram of a first embodiment of the present invention, which best shows the features of the present invention. Referring to FIG. 2(A), a silicon (Si) substrate 1 and another silicon substrate 2 to be bonded to the Si substrate 1 are provided. An LB film 50 consisting of a couple of monomolecular films 4, 5 has been deposited on a surface of the Si substrate 2. The LB film on the Si substrate 2 consists of hydrophilic groups 7 and 9 and hydrophobic groups 8 and 10. There are also provided a power source 17 for generating an electric field between the Si substrate 1 and the Si substrate 2, a switch 18 for switching on and off the electric field, and lead wires 21 for electrically connecting the Si substrates 1 and 2, the power source 17 and the switch 18.

In this arrangement, the 2-layer LB film 50 is first built up on the surface of the Si substrate 2, and the bonding surface of the Si substrate 1 previously cleaned is positioned and superposed on the LB film 50. The surfaces of the Si substrates 1 and 2, however, are not perfectly flat as observed on an atomic level, and have innumerable irregularities or undulations. Therefore, the Si substrate 1 and the LB film 50 on the Si substrate 2 are not bonded through the entire area thereof. Accordingly, the bonding strength is small.

Figure 2B:
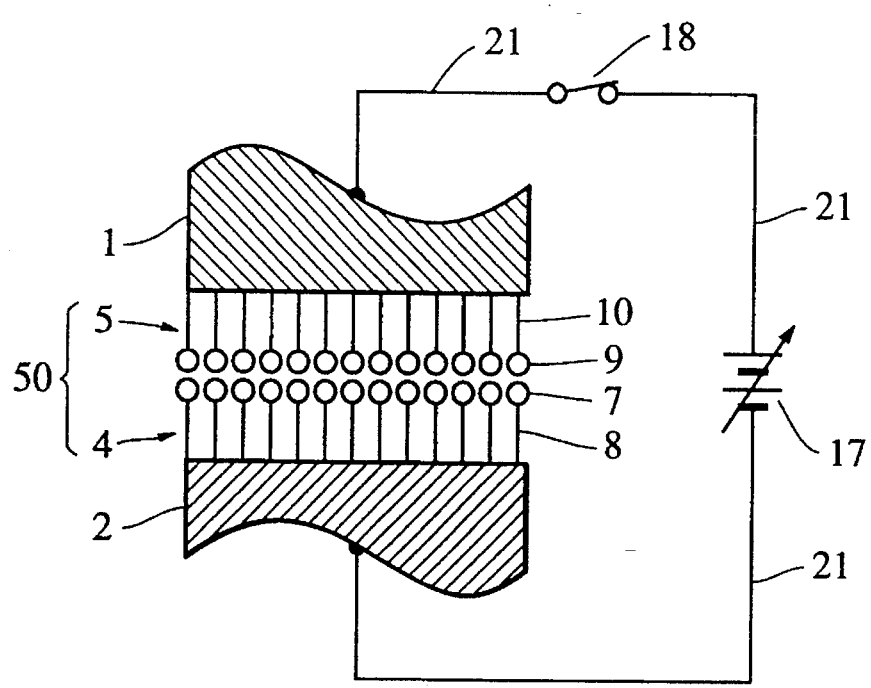

Then, as shown in FIG. 2 (B), the switch 18 is turned on to apply an electric field between the Si substrates 1 and 2. Electrostatic attraction is caused between the Si substrate 1 and the Si substrate 2 by the electric field so that the gap between the Si substrate 1 and the LB film 50 formed on the Si substrate 2 is gradually reduced with time until the distance therebetween is reduced to an interatomic distance at any position in the bonding area. Even if the switch 18 is turned off at this time to remove the electrostatic attraction, the Si substrate 1 and the LB film 50 are maintained in a bonded state by the intermolecular force such that the Si substrate 1 is bonded to the Si substrate 2 through the LB film 50 as an intermediate layer, provided that at least one of the Si substrates 1 and 2 is a thin plate having a sufficiently small rigidity. For bonding through the entire area, it is necessary to increase the electrostatic attraction. Therefore, a thin film having a very small thickness, easy to form and having a high withstand voltage is preferred as the intermediate layer. In an example of the process of this embodiment, arachidic acid LB film was used as the intermediate layer and a voltage of about 5 V from power source 17 was applied for about 30 minutes at room temperature, as shown in FIG. 2(B). The Si substrates 1 and 2 were thereby bonded to each other.

According to the present invention, fatty acids other than arachidic acid (e.g., stearic acid, behenic acid) also can be used. Moreover, ferroelectric LB film (e.g., diacetylene, or benzene derivative LB film) or a polyimide LB film may be used as the intermediate layer to achieve the desired effect of the invention.

[Embodiment 2]

Figure 3:
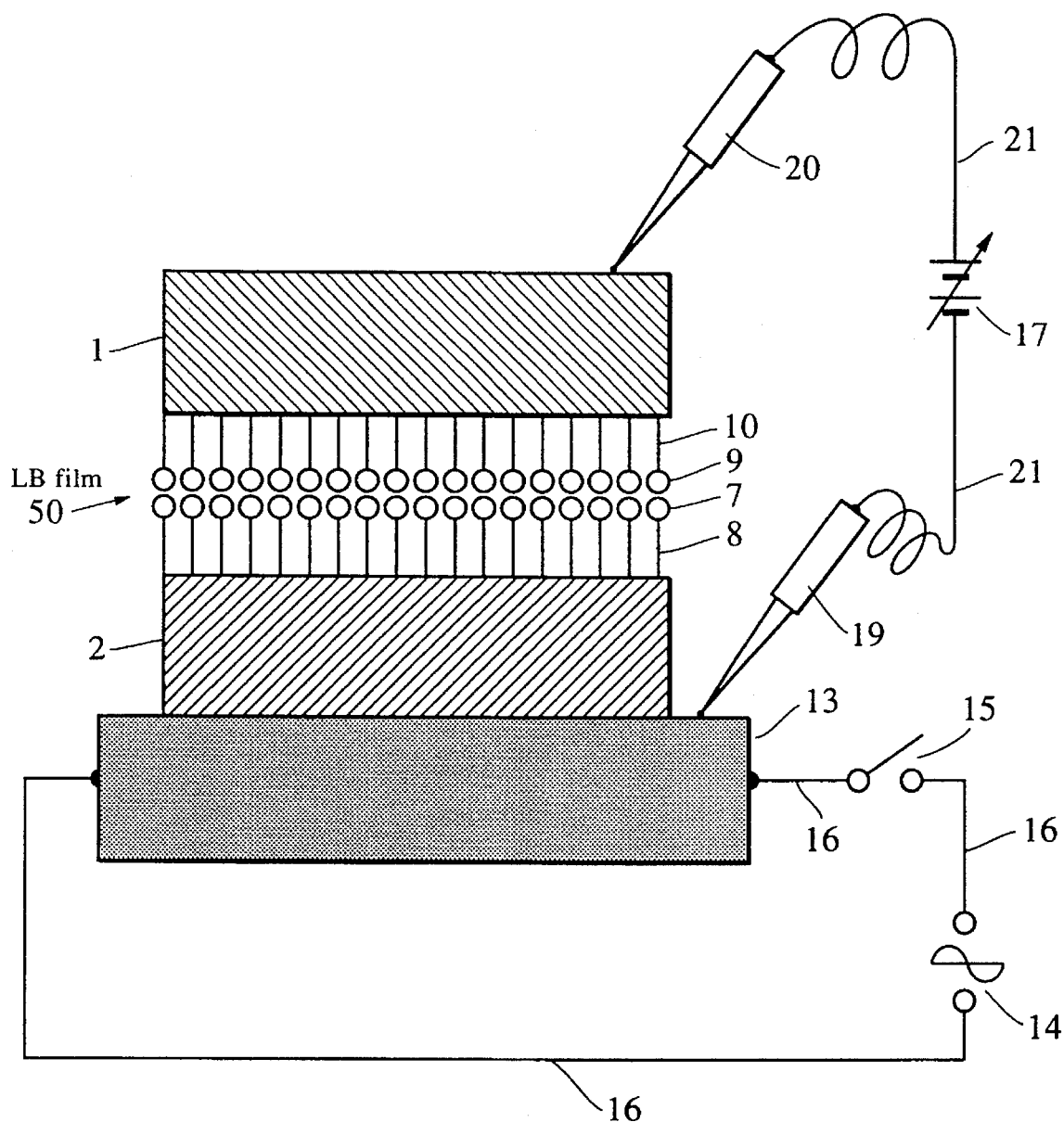
FIG. 3 is a cross-sectional view of bonding in accordance with a second embodiment of the present invention.

FIG. 3 is a diagram of a second embodiment of the present invention, which best shows the features of the present invention. Referring to FIG. 3, a Si substrate 1 and another Si substrate 2 to be bonded to the Si substrate 1 are provided. A 2-layer LB film 50 is formed on a surface of the Si substrate 2. The LB film material has hydrophilic groups 7 and 9 and hydrophobic groups 8 and 10. There are also provided a platen 13 with a heater for heating the Si substrates 1 and 2, a heating power source 14 for heating of the heater of the platen 13, a switch 15 for turning the heater on and off, lead wires 16 for electrically connecting the platen 13, the switch 15 and the heating power source 14, a power source 17 for generating an electric field between the Si substrate 1 and the Si substrate 2, probe-like electrodes 19 and 20 electrically connected to the platen 13 and the Si substrate 1, respectively (the platen 13 and the Si substrate 2 being electrically connected to each other), and lead wires 21 for electrically connecting the probe-like electrodes 19 and 20 and the power source 17.

In this arrangement, the LB film 50 is first built up on the surface of the Si substrate 2, and the bonding surface of the Si substrate 1 previously cleaned is positioned and superposed on the LB film 50. Thereafter, an electric field is applied between the Si substrates 1 and 2 by the power source 17. By electrostatic attraction caused by this electric field, the gap between the Si substrate 1 and the LB film 50 is reduced to an interatomic distance.

Further, while the electric field is being applied between the Si substrates 1 and 2, the switch 15 is turned on to heat the Si substrates 1 and 2 with the platen 13 so that the LB film 50 is decomposed and evaporated. By the decomposition and evaporation, the LB film 50 disappears. At this time, since the distance between the Si substrates 1 and 2 has been reduced to such a distance that an interatomic force or intermolecular force acts therebetween, the Si substrates 1 and 2 can be bonded directly to each other.

In an example of the process of this embodiment, a stearic acid built-up film was used as LB film 50, and the substrates and the films were gradually heated up to a temperature of 350° C or higher while a voltage of about 6 V was applied between the Si substrates 1 and 2. By this processing for about 1 hour, the Si substrates 1 and 2 were bonded to each other firmly to such a degree that they were not separated during cutting with a disk cutter.

According to the present invention, an electroconductive substrate (e.g., a substrate formed of an insulating member and an electroconductive film formed on a surface of the insulating member, or a substrate processed by ion injection to be made electroconductive) may be used instead of the above-described Si substrate to achieve the desired effect of the invention.

[Embodiment 3]

Figure 4:
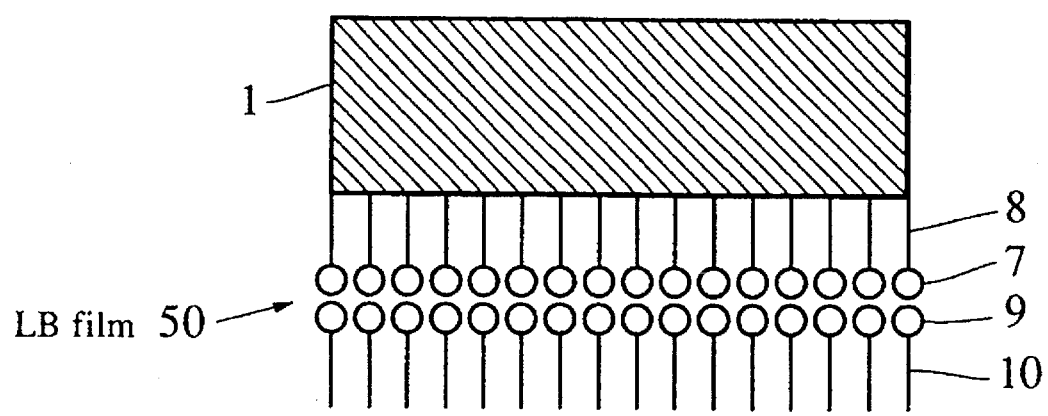
FIG. 4 is a cross-sectional view of a sample before bonding in accordance with a third embodiment of the present invention.
Figure 4:
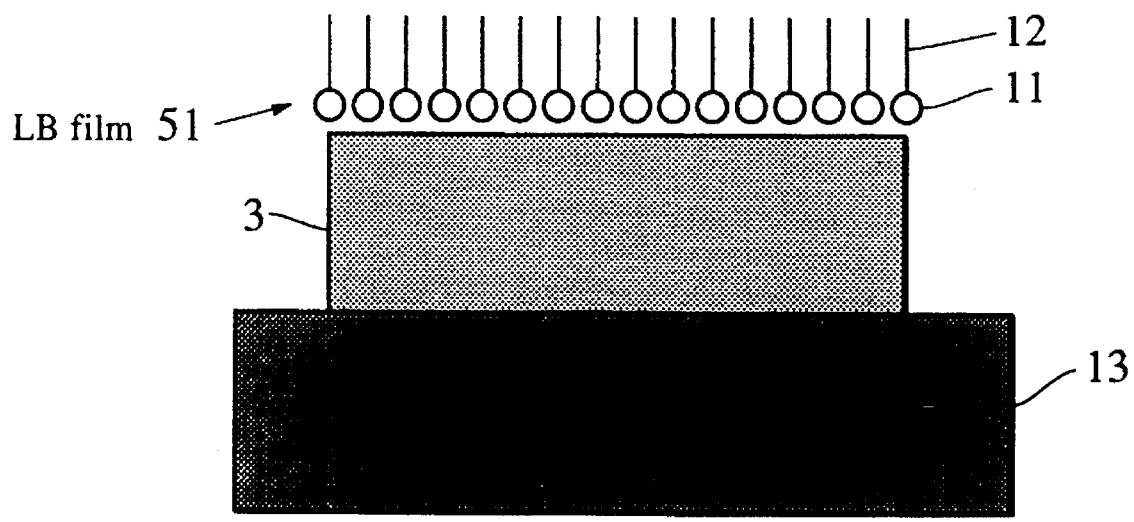
Figure 5:
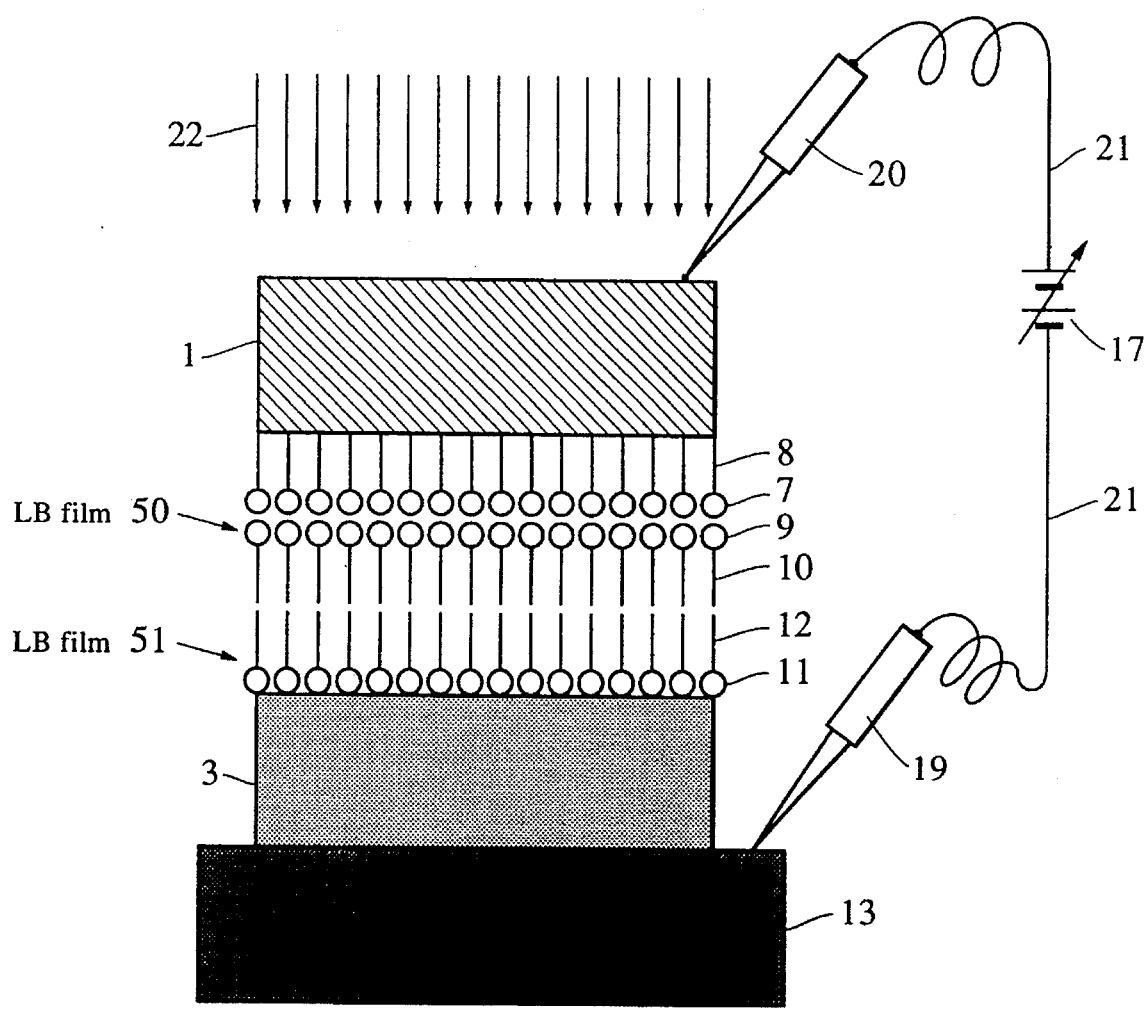
FIG. 5 is a cross-sectional view of bonding in accordance with the third embodiment of the present invention.

FIGS. 4 and 5 are diagrams of a third embodiment of the present invention, which best shows features of the present invention. Referring to FIGS. 4 and 5, a Si substrate and a crystal substrate 3 to be bonded to the Si substrate 1 are provided. LB film 50 is built up on a surface of the Si substrate 1, and an LB film 51 is built up on a surface of the crystal substrate 3. The film material of LB film 50 has hydrophilic groups 7 and 9 and hydrophobic groups 8 and 10. The material of LB film 51 has hydrophilic groups 11 and hydrophobic groups 12. There is also provided a platen 13 on which the crystal substrate 3 and the Si substrate 1 are mounted. FIG. 4 shows a sample before bonding in accordance with the claimed invention. FIG. 5 shows a power source 17 for applying an electric field between the Si substrate 1 and the crystal substrate 3, probe-like electrodes 19 and 20 electrically connected to the crystal substrate 3 and the Si substrate 1, respectively (the platen 13 being formed of an electroconductive material), lead wires 21 for electrically connecting the probe-like electrodes 19 and 20 and the power source 17, and laser light 22 with which an interface between the Si substrate 1 and the crystal substrate 3 and the LB films 50 and 51 are irradiated.

In this arrangement, a 2-layer LB films 50 and a 1-layer of LB film 51 are first formed on the Si substrate 1 and the crystal substrate 3 respectively. Then, the LB film 50 on the Si substrate 1 is opposed to the LB film 51 on the crystal substrate 3 from above, and is positioned and superposed on the LB film 51. Thereafter, an electric field is applied between the Si substrate 1 and the crystal substrate 3 by the power source 17. By electrostatic attraction caused by this electric field, the gap between the LB film 50 on the Si substrate 1 and the LB film 51 on the crystal substrate 3 is reduced to an interatomic distance through the entire area thereof. Further, while the electric field is being applied between the Si substrate 1 and the crystal substrate 3, laser light 22 is irradiated from a position above the Si substrate 1 to decompose and evaporate the LB films 50 and 51. By decomposition and evaporation, the LB films 50 and 51 disappear. At this time, since the distance between the Si substrate 1 and the crystal substrate 3 has been reduced to such a distance that an interatomic force or intermolecular force acts therebetween, the Si substrate and the crystal substrate 3 can be bonded directly to each other.

In an example of the process of this embodiment, behenic acid was used for the LB film 50 and stearylamine for the LB film 51. $CO_2$ laser light was irradiated (at about 5 $W/cm^2$) while a voltage of about 200 V was applied between the Si substrate and the crystal substrate 3. By this processing for about 1 hour, the Si substrate and the crystal substrate 3 were bonded to each other firmly to such a degree that they were not separated during cutting with a disk cutter.

According to the present invention, an insulating member in which movable ions are added as an impurity or intentionally (e.g., Pyrex glass #7740 (Pyrex is a trade name of Corning) or the like) may be used instead of the above-described crystal substrate to achieve the desired effect of the invention.

As described above, the solid phase bonding method of the present invention uses a monomolecular film or a monomolecular built-up film between interfaces and is therefore advantageous as described below.

(1) In the solid phase bonding process, a bonding strength large enough to prevent separation of substrates can be obtained only by superposing the substrates on each other with a small load. The positioning (alignment) operation and handling after positioning are thereby facilitated. Therefore, post-processing for sufficiently increasing the bonding strength after positioning becomes simpler and easier.

(2) The LB film is used in an initial bonding step and the LB film is thereafter removed by being heated to a temperature (about 300° C. or higher) at which the LB film can be decomposed and evaporated. Therefore, the bonding strength between the electroconductive substrates can be further improved.

(3) The LB film is used in an initial bonding step, and decomposition/evaporation of the LB film is thereafter effected by laser light irradiation. Laser light is uniformly irradiated successively from a bonding center to a peripheral bonding position to enable the substrates to be uniformly junctioned through the entire bonding area.

While the present invention has been described with respect to what presently are considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for bonding at least two solid members, comprising:

a step (A) of forming at least one of i) a monomolecular film; and ii) a monomolecular built-up film on at least one of two interfaces;

a step (B) of adhering the solid members through the interfaces;

a step (C) of applying an electric field to the interfaces;

and a step (D) of heating the interfaces in order to evaporate said monomolecular film or monomolecular built-up film to bond said solid members directly.

2. A method for bonding at least two solid members, comprising;

a step (A) of forming at least one of i) a monomolecular film; and ii) a monomolecular built-up film on at least one of two interfaces;

a step (B) of adhering the solid members through the interfaces;

a step (C) of applying an electric filed to the interfaces; and

A step (E) or irradiating the interfaces with laser light in order to evaporate said monomolecular film or monomolecular built-up film to bond said solid members directly.

3. A method according to claim 1, wherein said step (C) and said step (D) are executed in sequence.

4. A method according to claim 1, wherein said step (C) and said step (D) are executed substantially simultaneously.

5. A method according to claim 2, wherein said step (C) and said step (E) are executed in sequence.

6. A method according to claim 2, wherein said step (C) and said step (E) are executed substantially simultaneously.

7. A method according to any of claims 1 to 2, wherein at least one of the solid members is an electroconductive member.

8. A method according to any of claims 1 to 2, wherein at least one of the monomolecular film and the monomolecular built-up film has an insulating property.

9. A method according to any of claims 1 to 2, wherein at least one of the monomolecular film and the monomolecular built-up film is formed of a straight chain saturated fatty acid.

10. A method according to claim 1, wherein said heating is provided by a heater.

11. A method according to claim 2, wherein the laser light has a wavelength range of 0.2 to 12 μm.

12. A method for bonding at least two solid members, comprising:

a step (A) of forming at least one of i) a monomolecular film; and ii) a monomolecular built-up film on at least one of two interfaces;

a step (B) of adhering the solid members through the interfaces;

a step (C) of applying an electric field to the interfaces;

a step (D) of evaporating said monomolecular film or monomolecular built-up film to bond said solid members directly.

* * * * *